(12) United States Patent
Shimizu et al.

(10) Patent No.: US 8,901,751 B2
(45) Date of Patent: Dec. 2, 2014

(54) SEMICONDUCTOR DEVICE, ELECTRONIC DEVICE, AND SEMICONDUCTOR DEVICE MANUFACTURING METHOD

(71) Applicant: Fujitsu Limited, Kawasaki-shi, Kanagawa (JP)

(72) Inventors: Kozo Shimizu, Atsugi (JP); Seiki Sakuyama, Isehara (JP); Toshiya Akamatsu, Zama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/632,268

(22) Filed: Oct. 1, 2012

(65) Prior Publication Data

US 2013/0087912 A1    Apr. 11, 2013

(30) Foreign Application Priority Data

Oct. 5, 2011 (JP) ................................ 2011-221364
Aug. 10, 2012 (JP) ................................ 2012-178509

(51) Int. Cl.
*H01L 23/498* (2006.01)
*H01L 25/065* (2006.01)
*H01L 23/00* (2006.01)
*H01L 21/50* (2006.01)
*H01L 23/538* (2006.01)
*H01L 23/31* (2006.01)

(52) U.S. Cl.
CPC ....... *H01L 21/50* (2013.01); *H01L 2224/16506* (2013.01); *H01L 2224/81931* (2013.01);
(Continued)

(58) Field of Classification Search
CPC ............ H01L 2021/60022; H01L 2924/18161
USPC .......................................... 257/737, 778, 779
See application file for complete search history.

(56) References Cited

U.S. PATENT DOCUMENTS 7,960,831 B2 * 6/2011 Hua et al. ..................... 257/738
2007/0284741 A1 12/2007 Hua et al.
(Continued)

FOREIGN PATENT DOCUMENTS

TW    200929454    7/2009

OTHER PUBLICATIONS

K. Yasaka, et al.; "Microstructural Changes in Micro-joints between Sn-58Bi Solders and Copper by Electro-migration;" ICEP 2010 Proceedings; FA2-1; Feb. 1, 2010; pp. 475-478 (4 Sheets)/p. 3 of specification.
(Continued)

*Primary Examiner* — Telly Green
*Assistant Examiner* — Damian A Hillman
(74) *Attorney, Agent, or Firm* — Kratz, Quintos & Hanson, LLP

(57) ABSTRACT

A semiconductor device, includes: a connection member including a first pad formed on a principal surface thereof; a semiconductor chip including a circuit-formed surface on which a second pad is formed, the chip mounted on the connection member so that the circuit-formed surface faces the principal surface; and a solder bump that connects the first and second pads and is made of metal containing Bi and Sn, wherein the bump includes a first interface-layer formed adjacent to the second pad, a second interface-layer formed adjacent to the first pad, a first intermediate region formed adjacent to either one of the interface-layers, and a second intermediate region formed adjacent to the other one of the interface-layers and formed adjacent to the first intermediate region; Bi-concentration in the first intermediate region is higher than a Sn-concentration; and a Sn-concentration in the second intermediate region is higher than a Bi-concentration.

10 Claims, 17 Drawing Sheets

(52) U.S. Cl.
CPC . *H01L 2224/48091* (2013.01); *H01L 23/49816*
(2013.01); *H01L 2224/32225* (2013.01); *H01L*
*25/0655* (2013.01); *H01L 2224/16238*
(2013.01); *H01L 2924/01327* (2013.01); *H01L*
*2224/13111* (2013.01); *H01L 23/5383*
(2013.01); *H01L 2224/81805* (2013.01); *H01L*
*24/16* (2013.01); *H01L 2224/73265* (2013.01);
*H01L 2224/81447* (2013.01); *H01L 24/81*
(2013.01); *H01L 2224/48227* (2013.01); *H01L*
*2224/16145* (2013.01); *H01L 2225/0651*
(2013.01); *H01L 2224/81002* (2013.01); *H01L*
*2225/06513* (2013.01); *H01L 23/3128*
(2013.01); *H01L 2924/01322* (2013.01); *H01L*
*24/13* (2013.01); *H01L 25/0657* (2013.01);
*H01L 2224/8121* (2013.01); *H01L 2224/05647*
(2013.01); *H01L 23/49866* (2013.01); *H01L*
*2924/15311* (2013.01); *H01L 2224/81075*
(2013.01); *H01L 2224/83815* (2013.01); *H01L*
*23/49827* (2013.01); *H01L 2224/81893*
(2013.01); *H01L 2224/81191* (2013.01); *H01L*
*2924/15192* (2013.01)

USPC ............ 257/778; 257/779; 257/737; 257/777

(56) References Cited

U.S. PATENT DOCUMENTS

2008/0105984 A1* 5/2008 Lee .............................. 257/777
2009/0102037 A1 4/2009 Kim

OTHER PUBLICATIONS

Y. Ohtake, et al.; "Electro-migration in Microjoints between Sn-Bi Solders and Cu;" 16th Symposium on "Microjoining and Assembly Technology in Electronics"; Feb. 2, 2010; pp. 157-160 (4 Sheets)/p. 3 of specification.

Taiwanese Office Action dated Jul. 16, 2014, in the corresponding Taiwanese Patent Application No. 10320967720, with a partial translation.

Taiwanese Office Action dated Jul. 16, 2014, in the corresponding Taiwanese Patent Application No. 101135083, with a partial translation.

* cited by examiner

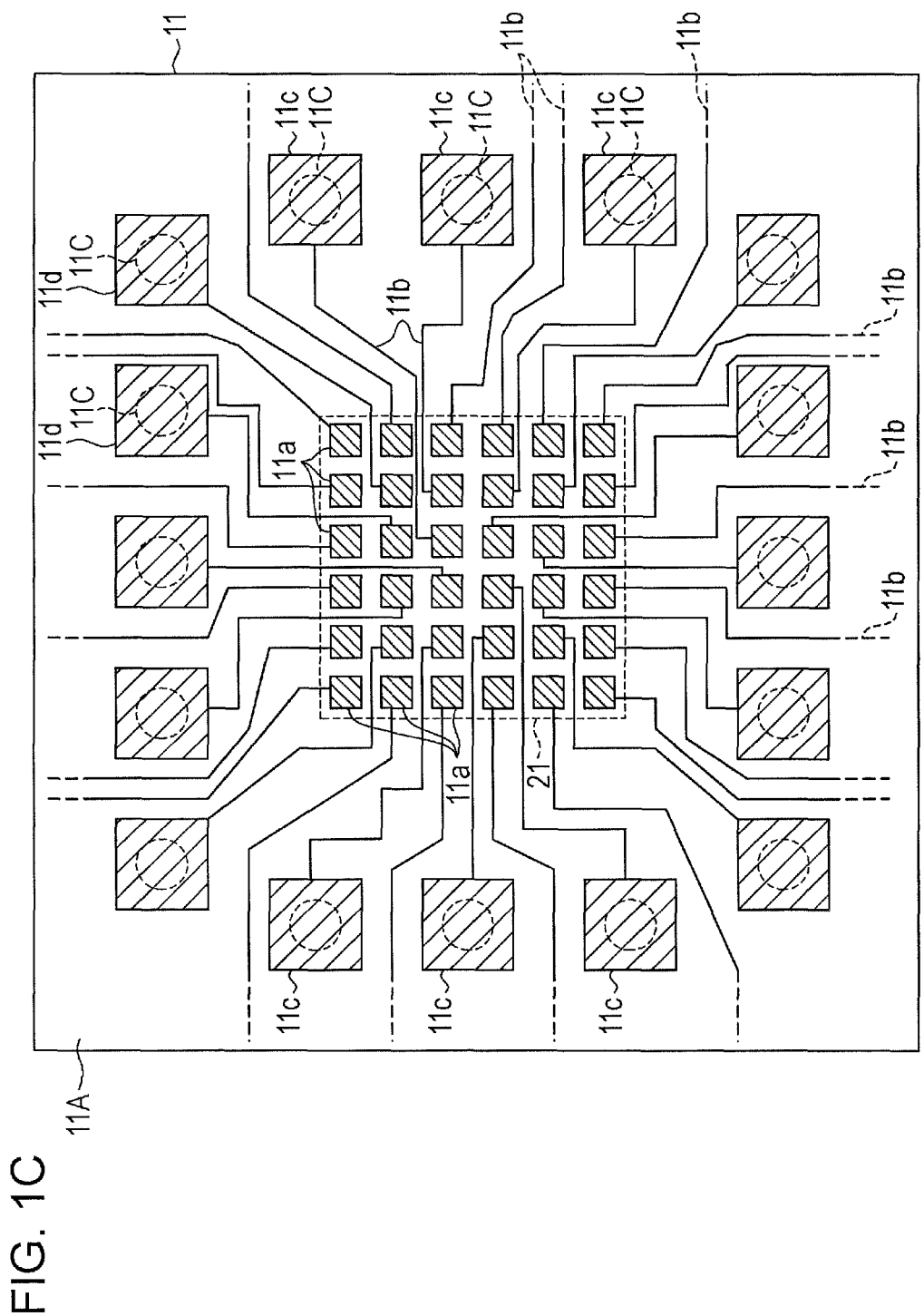

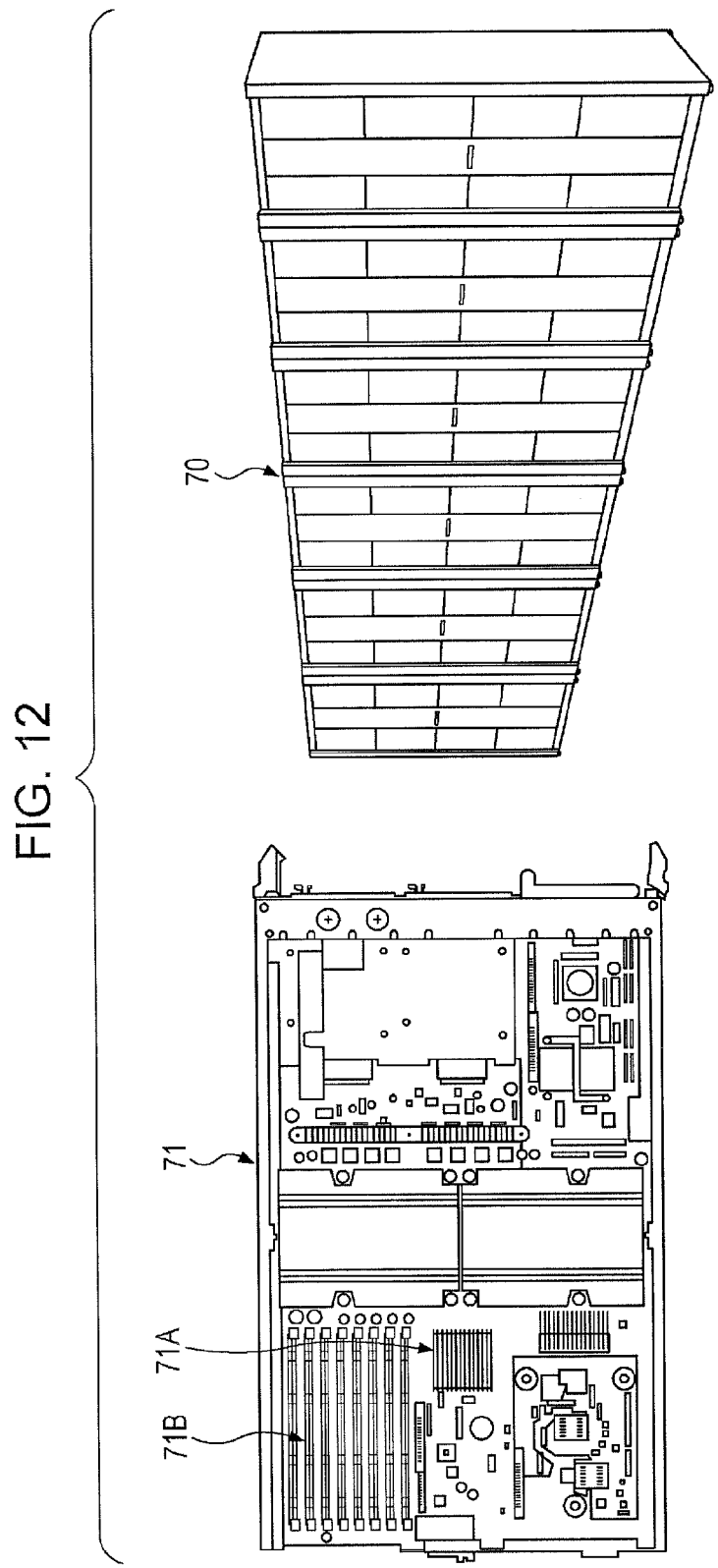

under, a generally-used lead-free solder for joining the connection terminals is used at a temperature of 217° C. or higher for joining, and is not suitable for joining at such a low temperature. Under such a situation, in mounting of the high-speed semiconductor elements containing the low-K materials, an eutectic Sn(tin)-Bi (bismuth) solder having a melting point of 139° C. or a solder in which a little amount of elements, such as Ag, Cu, and Sb, is added to Sn—Bi for the purpose of improving the mechanical characteristics, such as ductility, is used as a solder material capable of reducing thermal stress in many cases.

SEMICONDUCTOR DEVICE, ELECTRONIC DEVICE, AND SEMICONDUCTOR DEVICE MANUFACTURING METHOD

CROSS-REFERENCE TO RELATED APPLICATIONS

This application is based upon and claims the benefit of priority of the prior Japanese Patent Application No. 2012-178509, filed on Aug. 10, 2012, and the prior Japanese Patent Application No. 2011-221364, filed on Oct. 5, 2011, the entire contents of which are incorporated herein by reference.

FIELD

The embodiments discussed herein are related to a semiconductor device, an electronic device, and a method for manufacturing the same.

BACKGROUND

With an increase in integration density of semiconductor elements and an increase in packaging density of electronic components, the number of input/output terminals of the semiconductor elements and the electronic devices using the same is increasing. For example, in a semiconductor element to be flip-chip mounted, the pitch between connection terminals is reduced and further the area of the connection terminals is also reduced.

In order to achieve high-speed operation, severe demands are imposed on current semiconductor elements in which high-speed operation is desired. For example, in a current high-speed semiconductor element, such as a large scale integrated circuit (LSI), so-called low-K materials, such as porous silica, are used as an interlayer insulation film in order to reduce the parasitic capacitance between wiring patterns. However, the low-K materials have problems in that the materials generally have a low density corresponding to a low dielectric constant, and therefore the materials are mechanically vulnerable and are easily damaged due to thermal distortion during joining. For example, porous silica has an elastic modulus of 4 to 8 GPa, and the mechanical strength thereof is lower than that of conventional interlayer insulation materials, such as a silicon oxide film.

Under such a situation, the high-speed semiconductor elements containing the low-K materials are desired to reduce thermal distortion of a substrate during joining by joining the connection terminals at a low temperature when manufacturing a semiconductor device by flip-chip mounting of a semiconductor chip. However, a generally-used lead-free solder for joining the connection terminals is used at a temperature of 217° C. or higher for joining, and is not suitable for joining at such a low temperature. Under such a situation, in mounting of the high-speed semiconductor elements containing the low-K materials, an eutectic Sn(tin)-Bi (bismuth) solder having a melting point of 139° C. or a solder in which a little amount of elements, such as Ag, Cu, and Sb, is added to Sn—Bi for the purpose of improving the mechanical characteristics, such as ductility, is used as a solder material capable of reducing thermal stress in many cases.

As described above, the eutectic Sn—Bi solder has a melting point of 139° C. and may be mounted at a temperature lower by about 80° C. than, for example, an Sn—Ag—Cu solder (Melting point of 217° C.) which is a conventional lead-free solder.

However, there is a demand in an actual electronic device such that, in order to secure the reliability of the electronic device, the electronic device is subjected to a temperature cycle test or a high temperature exposure test at an environmental temperature of about 150° C. considering the actual environment. However, when such a test is performed, the environmental temperature (150° C.) of the test exceeds the melting point (139° C.) of the Sn—Bi solder, which may cause a problem of re-melting of a junction portion or the like.

In a semiconductor device or an electronic device having a configuration in which a large number of circuit boards and semiconductor chips are stacked, a problem may arise such that a portion, which is previously joined by reflowing solder bumps, melts in the reflow of solder bumps to be performed later in the semiconductor device or the electronic device.

Examples of the above-described related art is disclosed in Kenichi YASAKA, Yasuhisa OHTAKE, et al., "Microstructural Changes in Micro-joins between Sn-58Bi Solders and Copper by Electro-migration" ICEP 2010 Proceedings FA2-1, pp. 475-478, and OHTAKE et al., "Electro-migration in Microjoints between Sn—Bi Solders and Cu", 16th Symposium on Microjoining and Assembly Technology in Electronics, Feb. 2-3, 2010, Yokohama, pp 157-160.

SUMMARY

According to an aspect of the embodiments, a semiconductor device includes: a first connection member that includes a first connection pad formed on a first principal surface of the first connection member; a fast semiconductor chip that includes a circuit-formed surface on which a semiconductor integrated circuit is formed and a second connection pad formed on the circuit-formed surface, the fast semiconductor chip mounted on the first connection member in such a manner that the circuit-formed surface faces the first principal surface; and a solder bump that connects the first connection pad to the second connection pad and is made of metal containing Bi and Sn, wherein the solder bump includes a first interface layer formed adjacent to the second connection pad, a second interface layer formed adjacent to the first connection pad, a first intermediate region formed adjacent to either one of the first interface layer or the second interface layer, and a second intermediate region formed adjacent to the other one of the first interface layer and the second interface layer and formed adjacent to the first intermediate region; a concentration of Bi in the first intermediate region is higher than a concentration of Sn in the first intermediate region; and a concentration of Sn in the second intermediate region is higher than a concentration of Bi in the second intermediate region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1C is a plan view illustrating an example of a wiring pattern formed in members of FIG. 1A;

FIG. 12 is a perspective view illustrating an electronic device according to a fifth embodiment.

DESCRIPTION OF EMBODIMENTS

First Embodiment

Figure 1A:
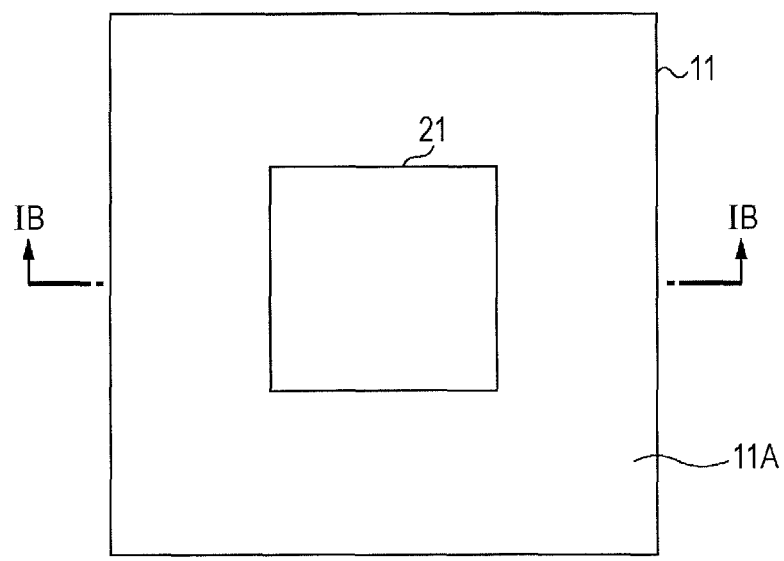
FIG. 1A is a plan view illustrating the configuration of a semiconductor device according to a first embodiment.
Figure 1B:
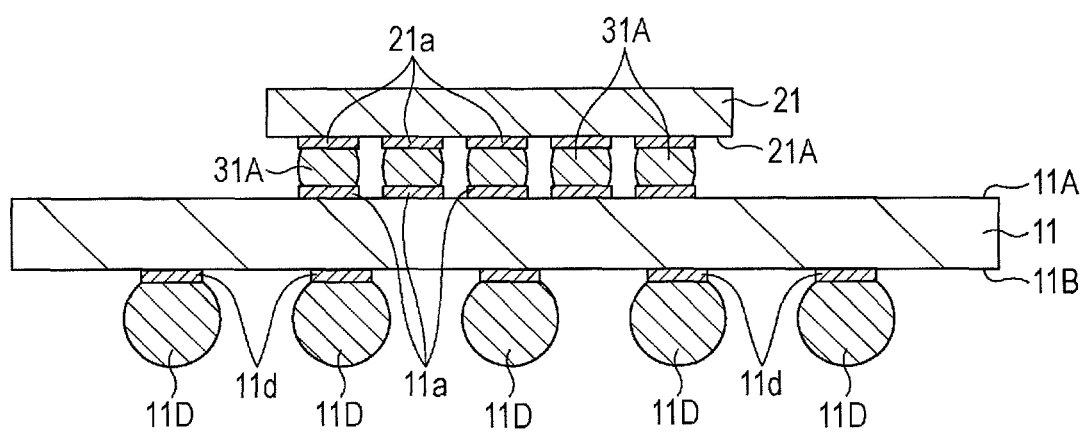
FIG. 1B is a cross sectional view along the IB-IB line of FIG. 1A.

FIG. 1A is a plan view illustrating the configuration of a semiconductor device 20 according to a first embodiment. FIG. 1B illustrates a cross sectional view along the IB-IB line of FIG. 1A.

Referring to FIG. 1A and FIG. 1B, the semiconductor device 20 has a circuit board 11 (fast connection member) and a semiconductor chip 21 (fast semiconductor chip), and the semiconductor chip 21 is flip-chip mounted on a mounting surface 11A (first principal surface) of the circuit board 11.

When described in more detail, the semiconductor chip 21 has a circuit-formed surface 21A on which a large scale integrated circuit (LSI) is formed. On the circuit formed surface 21A, a large number of electrode pads 21a (second connection pads 21a) containing copper (Cu), for example, are formed in a matrix shape. In contrast thereto, on the circuit board 11, electrode pads 11a (fast connection pads 11a) corresponding to the electrode pads 21a and similarly containing copper are formed in a matrix shape, for example, on the mounting surface 11A facing the circuit formed surface 21A of the semiconductor chip 21.

The semiconductor chip 21 is mounted on the circuit board 11 in such a manner that the circuit formed surface 21A faces the mounting surface 11A of the circuit board 11. The electrode pads 21a are electrically and mechanically connected to the corresponding electrode pads 11a by Sn—Bi solder bumps 31A.

On the mounting surface 11A of the circuit board 11, a large number of wiring patterns 11b each containing copper, for example, are formed as illustrated as the plan view of FIG. 1C. Each wiring pattern 11b extends from the electrode pad 11a to the electrode pad 11c provided corresponding to the electrode pad 11a on the mounting surface 11A. In the circuit board 11, through via plugs 11C schematically illustrated with the thick dashed line are formed corresponding to the electrode pads 11c. The through via plug 11C extends from the mounting surface 11A to a facing back surface 11B (second principal surface) through the circuit board 11. FIG. 1C is a plan view of the mounting surface 11A of the circuit board 11 excluding the semiconductor chip 21. In FIG. 1C, the semiconductor chip 21 is illustrated with the thin dashed line corresponding to the excluded state. On the back surface 11B, electrode pads 11d having a size larger than that of the electrode pads 11a are formed corresponding to the through via plugs 11C in a substantially matrix shape, for example, with a larger pitch than the pitch of the electrode pads 11a. On each electrode pad 11d, solder bumps 11D larger than the electrode pads 11a are formed. The electrode pad 11d may also be formed with copper and the solder bump 11D may also be formed from the same Sn—Bi solder as that of the solder bump 31A.

In the semiconductor device 20 of such a configuration, the electrode pads 21a of the semiconductor chip 21 flip-chip mounted on the circuit board 11 are electrically connected to the solder bumps 11D through the solder bumps 31A, the electrode pads 11a on the mounting surface 11A of the circuit board 11, the wiring patterns 11b and the electrode pads 11c on the mounting surface 11A, the through electrodes 11C, and the corresponding electrode pads 11d. The circuit board 11 may be provided with other active elements or passive elements on the mounting surface 11A, in the circuit board 11, or further on the back surface 11B.

Figure 2A:
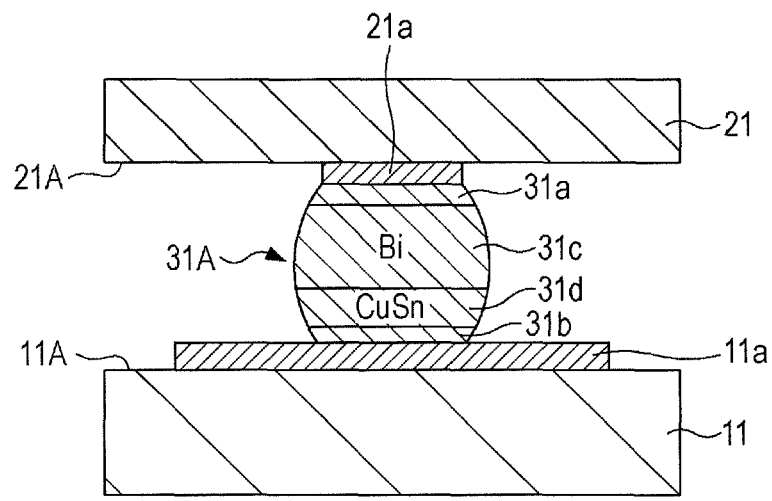
FIG. 2A is a cross sectional view illustrating the structure of a solder bump for use in the first embodiment.

FIG. 2A is a cross sectional view illustrating the configuration of the solder bump 31A in detail.

Referring to FIG. 2A, in this embodiment, a first interface layer 31a containing a copper-tin (Cu—Sn) alloy is formed contacting the electrode pad 21a containing copper, a second interface layer 31b containing a copper-tin alloy is formed contacting the electrode pad 11a similarly containing copper, and a first intermediate region 31c containing Bi (bismuth) in a concentration of 85 wt % or more as the main ingredients is formed contacting the first interface layer 31a in a laminated state in the solder bump 31A. Further, a second intermediate region 31d is formed between the first intermediate region 31c and the second interface layer 31b. The second intermediate region 31d containing a copper-tin alloy containing Sn in a high concentration is formed by a reaction of concentrated Sn (tin) into a neighborhood of the second interface layer 31b in the solder bump and the copper in the second interface layer 31b.

For example, when the solder bump 31A has a diameter of about 100 μm, the first intermediate region 31c and the second intermediate region 31d have a thickness reaching 65 μm and 35 μm, respectively, for example.

Figure 2B:
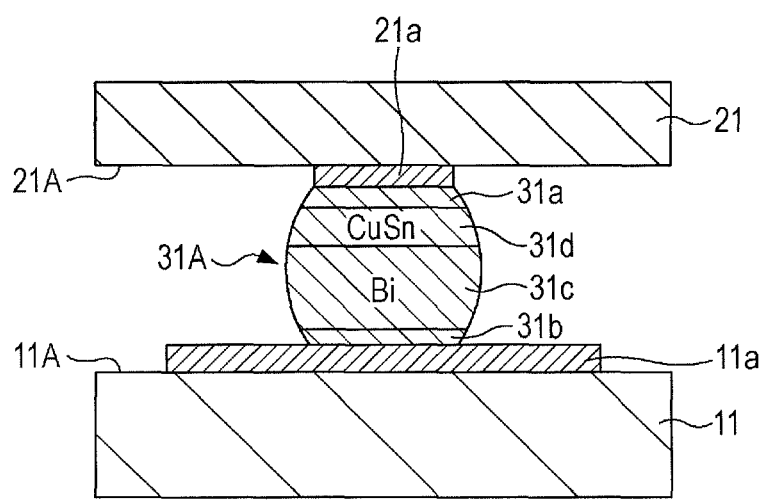
FIG. 2B is a cross sectional view illustrating the structure of a solder bump according to one modification of the first embodiment.

FIG. 2B illustrates a modification of the embodiment of FIG. 2A. In the modification of FIG. 2B, the first intermediate region 31c is formed contacting the second interface layer 31b and the second intermediate region 31d is formed contacting the first interface layer 31a.

The fast and the second intermediate regions 31c and 31d illustrated as FIG. 2A and FIG. 2B are formed by joining the semiconductor chip 21 at a reflow temperature of 139□C, for example, onto the circuit board 11 using an eutectic Sn—Bi solder as the solder bump 31A as described later, and then applying a direct current to the solder bump 31A to induce electromigration and have a feature of having a melting point exceeding 215□C, for example, which is still higher than that of the original Sn—Bi solder.

The fast and the second intermediate regions 31c and 31d illustrated as FIG. 2A and FIG. 2B are formed by joining the semiconductor chip 21, for example, at a reflow temperature of 139° C. onto the circuit board 11 using an eutectic Sn—Bi solder as the solder bump 31A, and subsequently applying a direct current to the solder bump 31A to induce electromigration, consequently, the solder bump 31A has a feature of having a melting point exceeding 215° C., for example, which is still higher than that of the original Sn—Bi solder, as described later.

Therefore, it is noted that although the solder bump 31A of FIG. 2A and FIG. 2B is formed at a low reflow temperature, the solder bump 31A does not re-melt even when the environmental temperature increases almost to the reflow temperature later and the electrical and mechanical connection between the semiconductor chip 21 and the circuit board 11 is stably maintained.

Hereinafter, formation processes of the structure of FIG. 2A are described with reference to FIG. 3A and FIG. 3B.

Figure 3A:
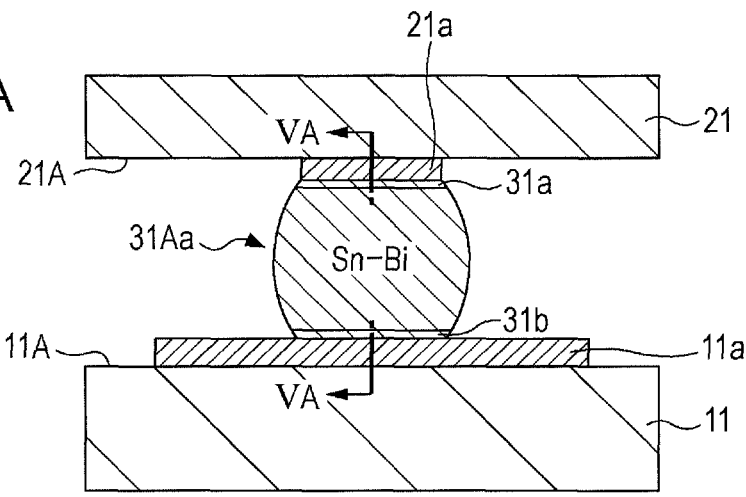
FIG. 3A is a view (No. 1) illustrating a formation process of the solder bump of FIG. 2A.

Referring to FIG. 3A, the semiconductor chip 21 is joined onto the circuit board 11 by reflowing a Sn—Bi solder bump 31Aa having a substantially eutectic composition at a temperature of 139° C. in a nitrogen gas atmosphere in this embodiment. By the heat treatment accompanied with the reflow, the first interface layer 31a is formed with a copper-tin alloy at a junction portion with the electrode pad 21a and the second interface layer 31b is similarly formed with a copper-tin alloy at a junction portion with the electrode pad 11a in the solder bump 31Aa. Hereinafter, the state of FIG. 3A is referred to as an "initial state".

Figure 3B:
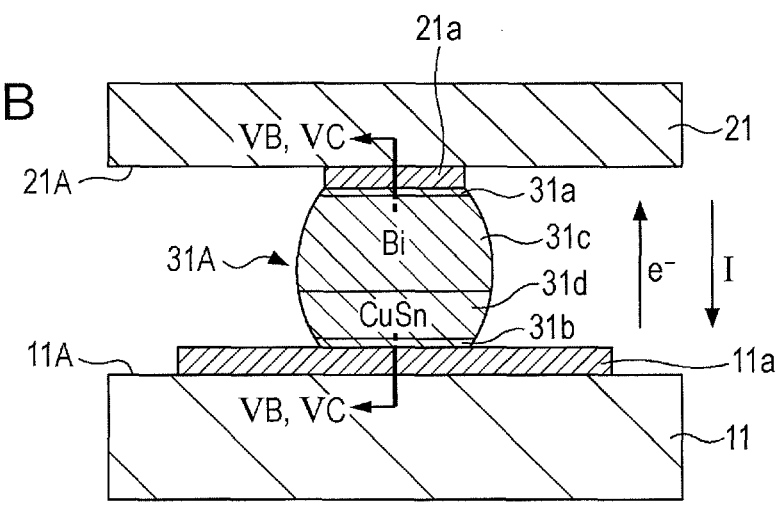
FIG. 3B is a view (No. 2) illustrating a formation process of the solder bump of FIG. 2A.

Next, as illustrated as FIG. 3B, in this embodiment, a direct current I is applied to the solder bump 31Aa using the electrode pad 21a as an anode and the electrode pad 31b as a cathode. It is known that when the direct current I is applied to the Sn—Bi solder, Bi concentrates to the anode side and Sn concentrates to the cathode side by electromigration (Microstructural Changes in Micro-joins between Sn-58Bi Solders and Copper by Electro-migration ICEP 2010 Proceedings FA2-1, pp. 475-478 and Otake, et al., 16th Symposium on "Microjoining and Assembly Technology in Electronics, Feb. 2-3, 2010, Yokohama).

Then, in this embodiment, segregation is induced in the solder bump 31Aa which is uniform at the beginning utilizing the electro migration phenomenon to form the first intermediate region 31c abundant in Bi and the second intermediate region 31d abundant in Sn.

Figure 4:
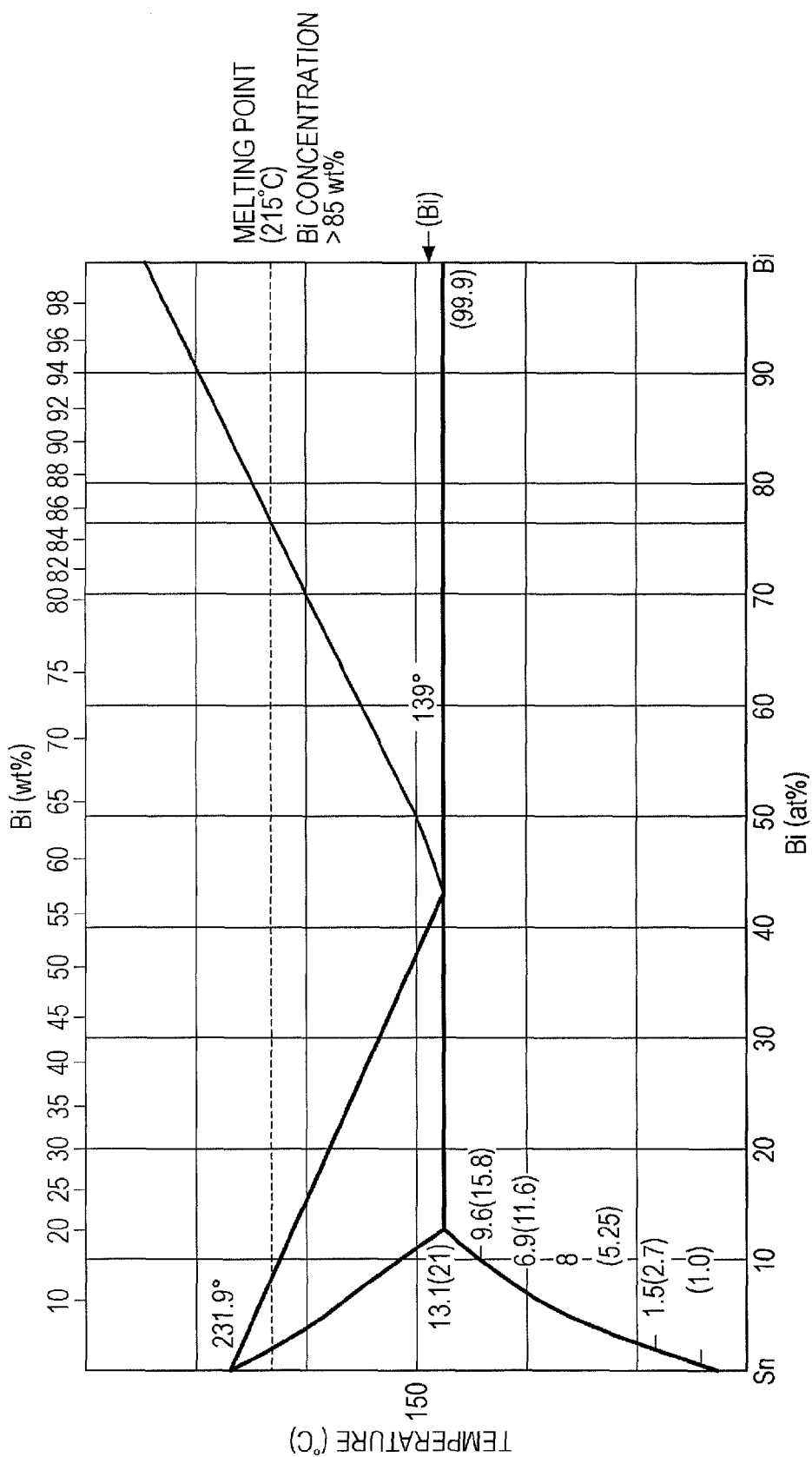
FIG. 4 is a phase diagram of a Sn—Bi binary system.

FIG. 4 is a phase diagram of a Sn—Bi binary system.

Referring to FIG. 4, when the Sn—Bi solder has a substantially eutectic composition, the melting point is about 139° C. Accordingly, the structure of FIG. 3A may be formed by joining at such a low temperature without producing an excessive thermal stress in the Low-K materials and the like used in the semiconductor chip 21.

Furthermore, by performing the electrification process of FIG. 3B, the concentration of Bi becomes higher in the first intermediate region 31c than that of the initial composition substantially corresponding to the eutectic composition, and thus the melting temperature of the first intermediate region 31c becomes higher than the melting temperature in the initial composition. Similarly, also in the second intermediate region 31d, the concentration of Sn becomes higher than that of the initial configuration, and also the melting temperature of the second intermediate region 31d becomes higher than that of initial configuration. More specifically, a preferable feature is obtained such that the melting temperature becomes higher in the solder bump 31A in which segregation has occurred as described above than the melting temperature of the solder bump 31Aa during joining. Hereinafter, the state of FIG. 3B is referred to as a "final state".

Figure 5A:
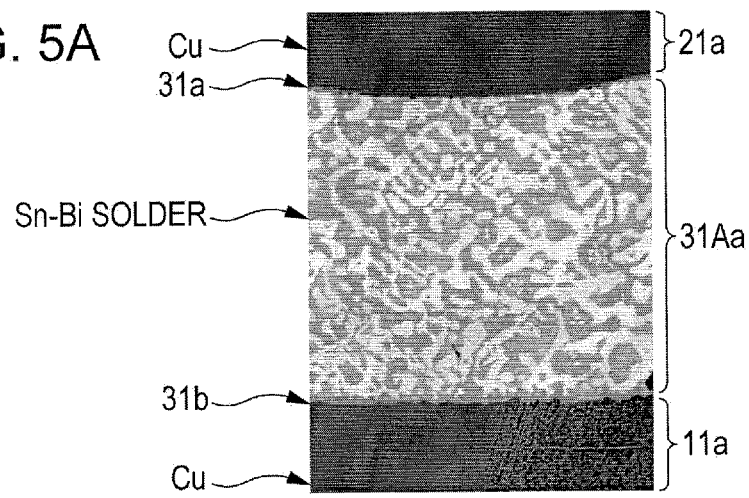
FIG. 5A is a SEM image illustrating the initial state of a solder bump.

FIG. 5A is a SEM (scanning electron microscope) image, corresponding to the initial state of FIG. 3A, of the section along the VA-VA line of the solder bump 31Aa before the application of the direct current I immediately after the reflow.

Referring to FIG. 5A, it is found that a characteristic organization is formed in an eutectic alloy where a bright domain abundant in Bi and a dark domain abundant in Sn are almost uniformly mixed in the solder bump 31Aa.

Figure 5B:
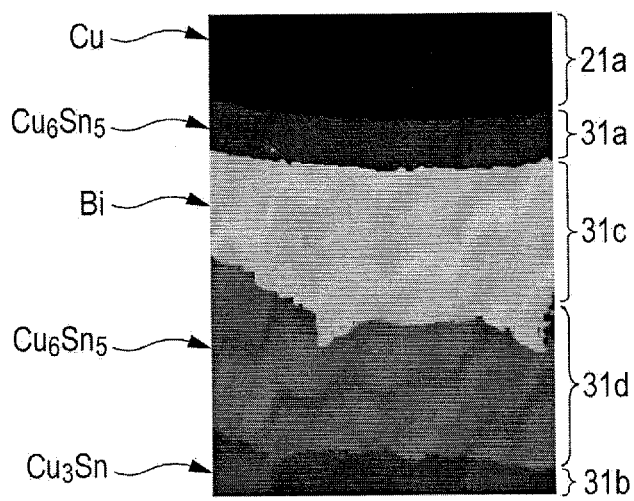
FIG. 5B is a SEM image illustrating the final state of a solder bump about Sample 1.

In contrast thereto, FIG. 5B illustrates the cross-sectional structure along the VB-VB line of FIG. 3B of the solder bump 31A after electrification, i.e., in the final state.

Referring to FIG. 5B, an alloy (intermetallic compound) layer having a composition of $Cu_6Sn_5$ is formed as the first interface layer 31a along the surface of the electrode pad 21a. Moreover, an alloy (intermetallic compound) layer having a composition of $Cu_3Sn$ is formed as the second interface layer 31b along the surface of the electrode pad 11a.

Furthermore, the first intermediate region 31c mainly containing Bi and substantially not containing Sn is formed in the shape of a layer adjacent to the first interface layer 31a, and a region mainly containing a $Cu_6Sn_5$ alloy (intermetallic compound) and substantially not containing Bi is formed in the shape of a layer as a whole between the first intermediate region 31c and the second interface layer 31b to form the second intermediate region 31d. The organization of FIG. 5B is obtained when a direct current is applied in the structure of FIG. 5A at a current density of 1.0 to $2.0 \times 10^8$ $Am^{-2}$ without heating from the electrode pad 21a to the electrode pad 11a, this is corresponding to Example 1 described later.

Figure 5C:
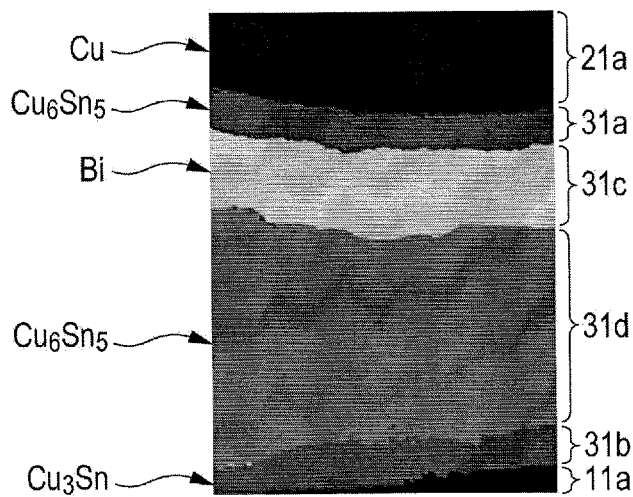
FIG. 5C is a SEM image illustrating the final state of a solder bump about Sample 2.

FIG. 5C represents the cross-sectional structure in the final state of another sample corresponding to Example 2 described later along the VC-VC line of the solder bump 31A after electrification of FIG. 3B.

Referring to FIG. 5C, an alloy (intermetallic compound) layer having a composition of $Cu_6Sn_5$ is formed as the first interface layer 31a along the surface of the electrode pad 21a in the same manner as in the case of FIG. 5B and an alloy (intermetallic compound) layer having a composition of $Cu_3Sn$ is formed as the second interface layer 31b along the surface of the electrode pad 11a.

Furthermore, also in the organization of FIG. 5C, the first intermediate region 31c mainly containing Bi and substantially not containing Sn is formed adjacent to the interface layer 31a in the shape of a layer. Furthermore, between the first intermediate region 31c and the second interface layer 31b, a region mainly containing a $Cu_6Sn_5$ alloy (intermetallic compound) and substantially not containing Sn is formed in the shape of a layer to form the second intermediate region 31d. The organization of FIG. 5C is obtained when a direct current is applied in the structure of FIG. 5A at a current density of 1.0 to $2.0 \times 10^8$ $Am^{-2}$ while heating the junction portions of the electrode pad 21a and the electrode pad 11a to be connected by the SnBi solder 31Aa to 100° C. or higher from the electrode pad 21a to the electrode pad 11a.

The results described in FIGS. 5B and 5C illustrate that Cu moves by diffusion into the solder bump 31Aa from the electrode pad 11a acting as the cathode with the application of the direct current and the Cu which moves by diffusion forms the interface layer 31b and the intermediate region 31d in the solder bump 31A by a reaction with Sn present in the solder bump 31Aa. The results of FIGS. 5B and 5C illustrate that Cu moves by diffusion into the solder bump 31Aa from the electrode pad 21a acting as the anode with the application of the direct current and the Cu which moves by diffusion forms the interface layer 31a in the solder bump 31A by a reaction with Sn present in the solder bump 31Aa.

Hereinafter, specific Examples are described.

Example 1

The electrode pad 21a was formed on the circuit formed surface 21A of the semiconductor chip 21 with a film thickness of 10 μm by electrolytic plating of a Cu film. The electrode pad 11a was formed on the mounting surface 11A (fast principal surface) of the circuit board 11 also with a film thickness of 10 μm by electrolytic plating of a Cu film. Then, the semiconductor chip 21 was mounted on the circuit board 11 by reflowing the solder bump 31A at a temperature of 139° C. in a nitrogen gas atmosphere corresponding to the process of FIG. 3A using a Sn—Bi solder containing a Bi composition in a proportion of 40 wt % to 70 wt % and having a substantially eutectic composition as the solder bump 31Aa.

Furthermore, using the electrode pad 21a as an anode and the electrode pad 11a as a cathode, the direct current I was applied to the solder bump 31A from the anode 21a side to the cathode 11a side in that state over 5 hours, in other words, an electron flow $e^-$ from the cathode 11a side to the anode 21a side was applied. In this experiment, the solder bump 31Aa was not intentionally heated from the outside during the electrification.

One obtained by such an experiment is the solder bump 31A having the layer organization illustrated above in FIG. 5B in which segregation of Bi and Sn occurred.

The semiconductor device 20 in which the semiconductor chip 21 was flip-chip mounted on the circuit board 11 thus obtained was confirmed for electrical connection, and then was subjected to 500 cycles of a temperature cycle test at temperatures between −5° C. and +125° C. Then, it was confirmed that an increase in resistance of the connecting portions was suppressed to 10% or lower by the solder bumps 31A. Moreover, the same semiconductor device 20 was allowed to stand in an environment where the temperature was 121° C. and the humidity was 85% for 1000 hours, and then the resistance of the connecting portions was investigated. Then, it was confirmed that an increase in resistance was 10% or lower.

Example 2

The electrode pad 21a was formed on the circuit formed surface 21A of the semiconductor chip 21 with a film thickness of 10 μm by electrolytic plating of a Cu film. The electrode pad 11a was formed on the mounting surface 11A of the circuit board 11 also with a film thickness of 10 μm by electrolytic plating of a Cu film. A flux was applied to the surface of the electrode pads 21a and 11a, and then the semiconductor chip 21 was mounted on the circuit board 11 by reflowing the solder bump 31A at a temperature of 139° C. in a nitrogen gas atmosphere corresponding to the process of FIG. 3A using a Sn—Bi solder containing a Bi composition in a composition of 40 wt % to 70 wt % and having a substantially eutectic composition as the solder bump 31Aa.

Furthermore, using the electrode pad 21a as an anode and the electrode pad 11a as a cathode, the direct current I was applied to the solder bump 31A from the anode 21a side to the cathode 11a side in that state over 5 hours, in other words, an electron flow $e^-$ was applied from the cathode 11a side to the anode 21a side. In this experiment, the temperature of the solder bump 31Aa was increased to a temperature of 100° C. or higher and 139° C. or lower, which was the original melting point, by heating from the outside during the electrification.

One obtained by such an experiment is the solder bump 31A having the layer organization illustrated above in FIG. 5C in which segregation of Bi and Sn occurred.

The semiconductor device 20 in which the semiconductor chip 21 was flip-chip mounted on the circuit board 11 thus obtained was confirmed for electrical connection, and then was subjected to 500 cycles of a temperature cycle test at temperatures between −25° C. and +125° C. Then, it was confirmed that an increase in resistance of the connecting portions was suppressed to 10% or lower by the solder bumps 31A. Moreover, the same semiconductor device 20 was allowed to stand in an environment where the temperature was 121° C. and the humidity was 85% for 1000 hours, and then the resistance of the connecting portions was investigated. Then, it was confirmed that an increase in resistance was 10% or lower.

Example 3

Thus, in this embodiment, copper (Cu) can be used as the electrode pads 21a and 11a. However, in addition thereto, other metal elements forming an intermetallic compound with Sn, such as, nickel (Ni), can also be used.

The electrode pad 21a was formed on the circuit formed surface 21A of the semiconductor chip 21 with a film thickness of 10 μm by electrolytic plating of a nickel (Ni) film. The electrode pad 11a was formed on the mounting surface 11A of the circuit board 11 also with a film thickness of 10 μm by electrolytic plating of a nickel film. A flux was applied to the surface of the electrode pads 21a and 11a, and then the semiconductor chip 21 was mounted on the circuit board 11 reflowing the solder bump 31A at a temperature of 139° C. in a nitrogen gas atmosphere corresponding to the process of FIG. 3A using a Sn—Bi solder containing a Bi composition in a proportion of 40 wt % to 70 wt % and having a substantially eutectic composition as the solder bump 31Aa.

Furthermore, using the electrode pad 21a as an anode and the electrode pad 11a as a cathode, the direct current I was applied to the solder bump 31A from the anode 21a side to the cathode 11a side in that state over 5 hours, in other words, an electron flow $e^-$ was applied from the cathode 11a side to the anode 21a side.

The semiconductor device 20 in which the semiconductor chip 21 was flip-chip mounted on the circuit board 11 thus obtained was confirmed for electrical connection, and then was subjected to 500 cycles of a temperature cycle test at temperatures between −25° C. and +125° C. Then, it was confirmed that an increase in resistance of the connecting portions was suppressed to 10% or lower by the solder bumps 31A. Moreover, the same semiconductor device 20 was allowed to stand in an environment where the temperature was 121° C. and the humidity was 85% for 1000 hours, and then the resistance of the connecting portions was investigated. Then, it was confirmed that an increase in resistance was 10% or lower.

Example 4

As described above, in this embodiment, although not only copper but nickel may be used as the electrode pads 21a and 11a, other metal elements forming an intermetallic compound with Sn, e.g., antimony (Sb), palladium (Pd), silver (Ag), gold (Au), platinum (Pt), cobalt (Co), and the like may be used.

The electrode pad 21a was formed on the circuit formation surface 21A of the semiconductor chip 21 with a film thickness of 3 to 4 μm by electrolytic plating of a palladium (Pd) film.

The electrode pad 11a was formed on the mounting surface 11A of the circuit board 11 also with a film thickness of 3 to 4 μm by electrolytic plating of a palladium film. A flux was applied to the surface of the electrode pads 21a and 11a, and then the semiconductor chip 21 was mounted on the circuit board 11 by reflowing the solder bump 31A at a temperature of 139° C. in a nitrogen gas atmosphere corresponding to the process of FIG. 3A using a Sn—Bi solder containing a Bi composition in a proportion of 40 wt % to 70 wt % and having a substantially eutectic composition as the solder bump 31Aa.

Figure 6:
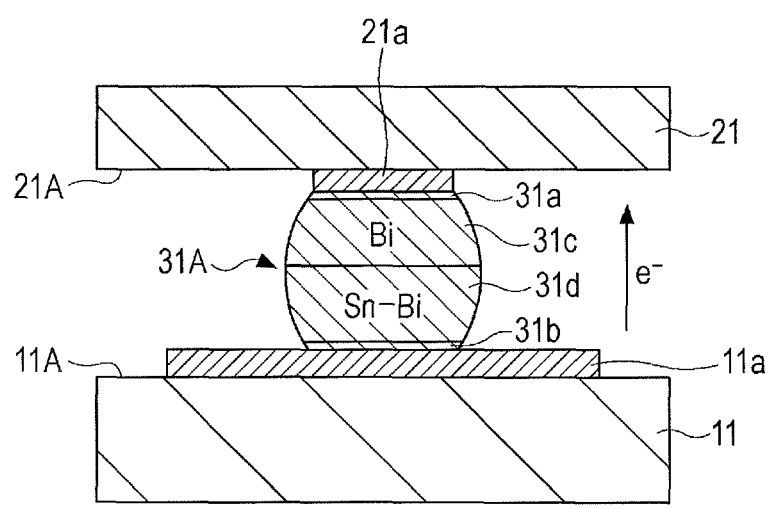
FIG. 6 is a cross sectional view illustrating another modification of a solder bump.

In this embodiment, an Sn—Bi alloy layer having a Sn concentration higher than that of the initial composition may also be formed as the second intermediate region 31d as illustrated as FIG. 6 by reducing the current density during electrification or by reducing the electrification time.

Furthermore, using the electrode pad 21a as an anode and the electrode pad 11a as a cathode, the direct current I was applied to the solder bump 31A from the anode 21a side to the cathode 11a side in that state, in other words, an electron flow $e^-$ was applied from the cathode 11a side to the anode 21a side over 3 hours.

The semiconductor device 20 in which the semiconductor chip 21 was flip-chip mounted on the circuit board 11 thus obtained was confirmed for electrical connection, and then was subjected to 500 cycles of a temperature cycle test at temperatures between −25° C. and +125° C. Then, it was confirmed that an increase in resistance of the connecting portion was suppressed to 10% or lower by the solder bump 31A. Moreover, the same semiconductor device 20 was allowed to stand in an environment where the temperature was 121° C. and the humidity was 85% for 1000 hours, and then the resistance of the connecting portion was investigated. Then, it was confirmed that an increase in resistance was 10% or lower.

Figure 3C:
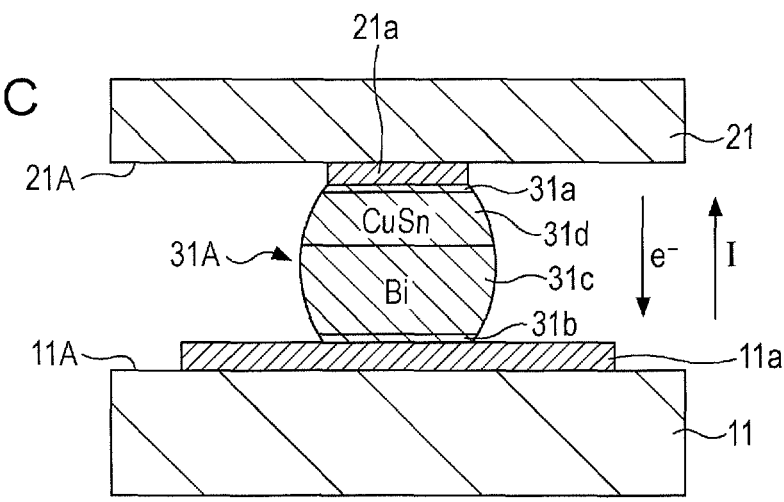
FIG. 3C is a view illustrating a formation process of the solder bump of FIG. 2B.

In this embodiment, the direction of applying the direct current is not limited to the direction from the electrode pad 21a to the electrode pad 11a as illustrated as FIG. 3B and may also be set to the direction from the electrode pad 11a to the electrode pad 21a illustrated as FIG. 3C. In this case, the electrode pad 11a serves as an anode and the electrode pad 21a serves as cathode and, in the solder bump 31A, a structure was formed such that the first intermediate region 31c was formed adjacent to the second interface layer 31b and the second intermediate region 31d was formed adjacent to the first interface layer 31a as described above with reference to FIG. 2B.

Second Embodiment

Hereinafter, a method for manufacturing the semiconductor device 20 according to a second embodiment is described with reference to FIG. 7A to FIG. 7D, FIG. 8A to FIG. 8D, FIG. 9A, FIG. 9B, FIG. 10A, FIG. 10B, and FIG. 11A to FIG. 11D.

Figure 7A:
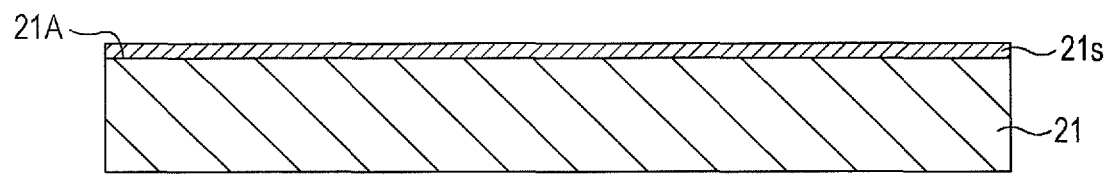
FIG. 7A is a view (No. 1) explaining a first portion of a manufacturing process of a semiconductor device according to a second embodiment.

Referring to FIG. 7A, on the circuit formed surface 21A of the semiconductor chip 21, a thin copper film or nickel film 21s is formed by a sputtering method, for example, as a seed layer for electrolytic plating with a film thickness of 50 nm to 200 nm. Furthermore, as illustrated as FIG. 7B, a resist film $R_1$ having an opening portion $R_1A$ corresponding to the electrode pad 21a to be formed is formed on the seed layer 21s.

Figure 7B:
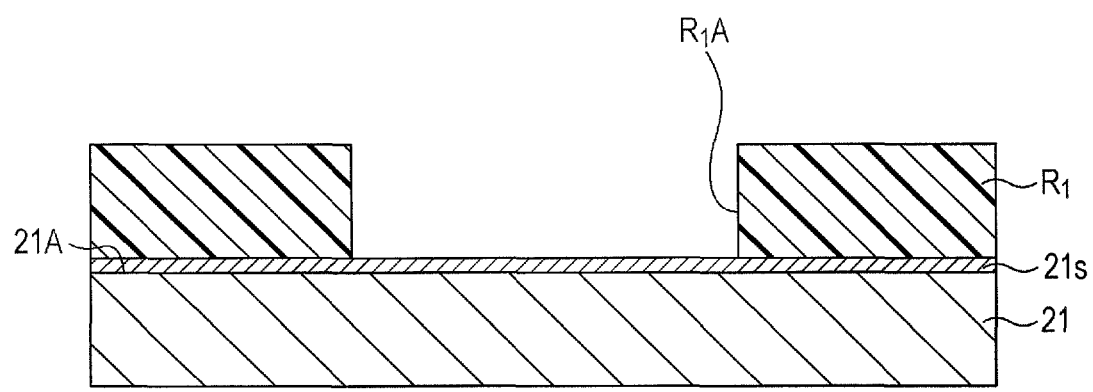
FIG. 7B is a view (No. 2) explaining a first portion of the manufacturing process of the semiconductor device according to the second embodiment.
Figure 7C:
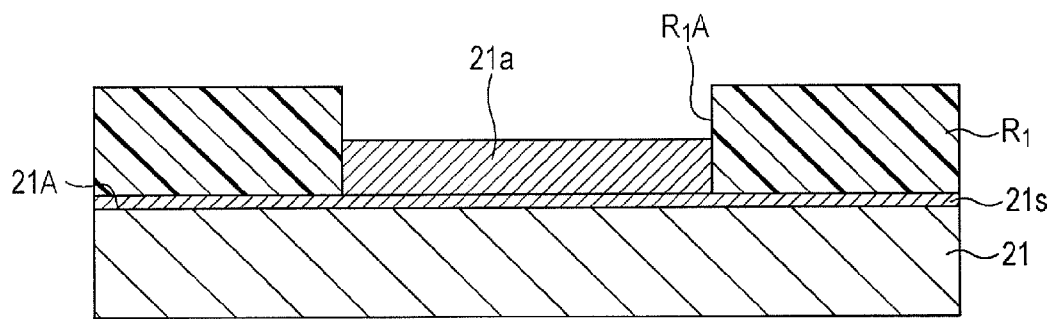
FIG. 7C is a view (No. 3) explaining a first portion of the manufacturing process of the semiconductor device according to the second embodiment.

Then, by immersing the structure of FIG. 7B in an electrolytic plating bath of copper or nickel, and performing electrolytic plating using the seed layer 21s as an electrode, the electrode pad 21a containing copper or nickel is formed on the seed layer 21s corresponding to the opening portion $R_1A$ with a film thickness of 1 μm to 5 μm, for example, as illustrated as FIG. 7C.

Figure 7D:
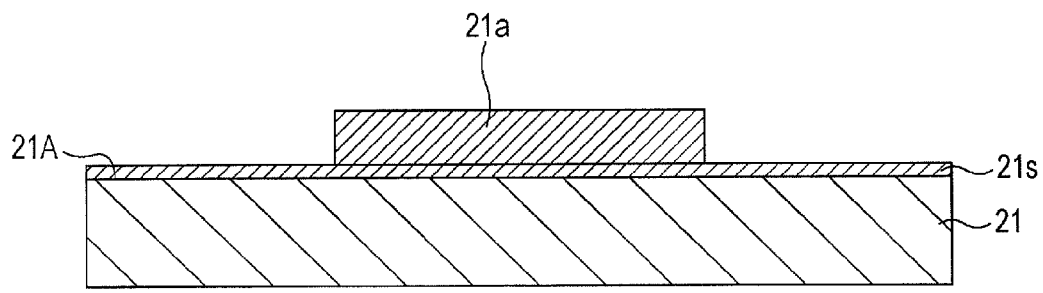
FIG. 7D is a view (No. 4) explaining a first portion of the manufacturing process of the semiconductor device according to the second embodiment.

Then, as illustrated as FIG. 7D, by removing the resist film $R_1$, the structure is obtained in which the electrode pad 21a is formed on the seed layer 21s covering the circuit formed surface 21A of the semiconductor chip 21.

Figure 8A:
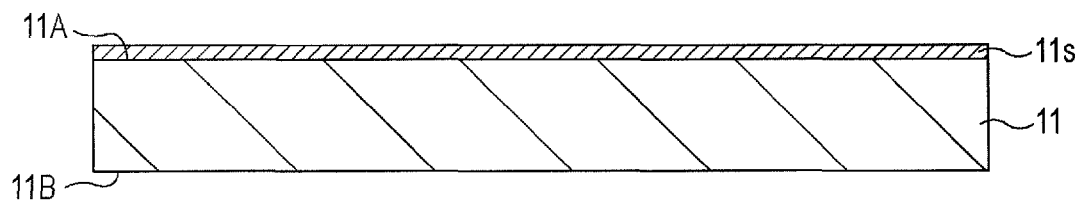
FIG. 8A is another view (No. 1) explaining a second portion of the manufacturing process of the semiconductor device according to the second embodiment.

In contrast, a thin copper film or nickel film 11s is formed with a film thickness of 50 nm to 200 nm as a seed layer for electrolytic plating by a sputtering method, for example, on the mounting surface 11A of the circuit board 11 as illustrated as FIG. 8A. Then, as illustrated as FIG. 8B, on the seed layer 11s, a resist film $R_2$ having an opening portion $R_2A$ corresponding to the electrode pad 11a to be formed is formed.

Figure 8B:
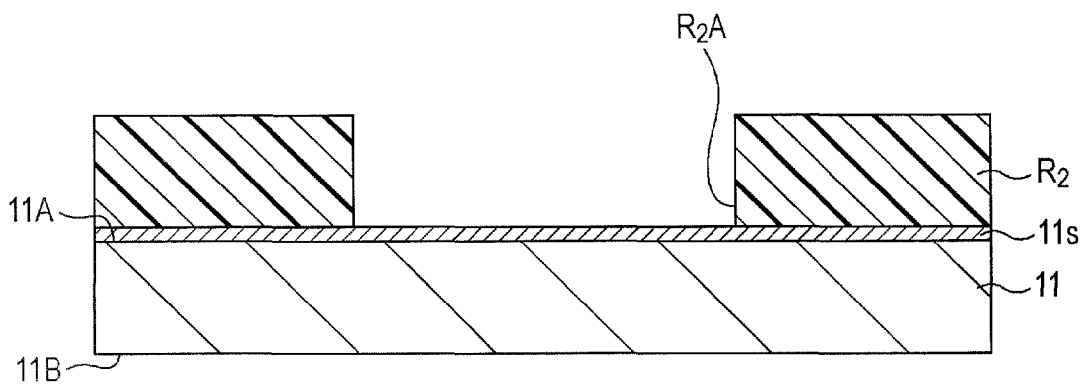
FIG. 8B is another view (No. 2) explaining the second portion of the manufacturing process of the semiconductor device according to the second embodiment.
Figure 8C:
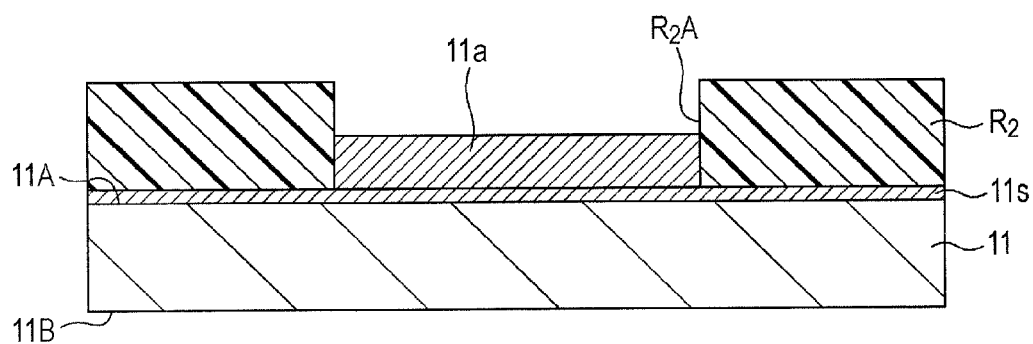
FIG. 8C is another view (No. 3) explaining the second portion of the manufacturing process of the semiconductor device according to the second embodiment.

By immersing the structure of FIG. 8B in an electrolytic plating bath of copper or nickel, and performing electrolytic plating using the seed layer 11s as an electrode, the electrode pad 11a containing copper or nickel is formed on the seed layer 11s corresponding to the opening portion $R_2A$ with a film thickness of 1 μm to 5 μm, for example, as illustrated as FIG. 8C.

Figure 8D:
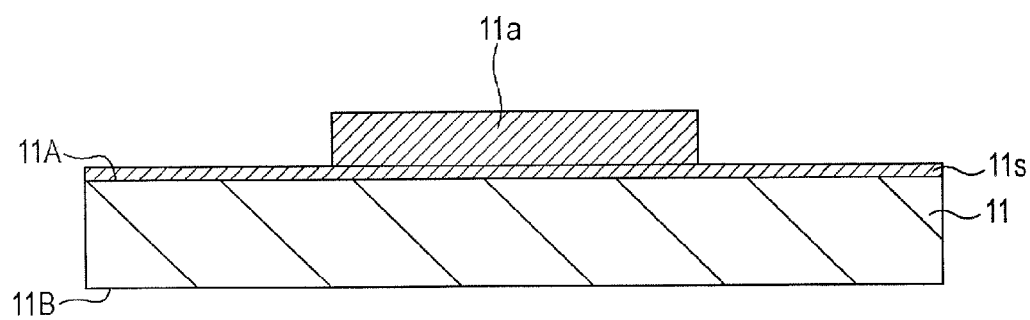
FIG. 8D is another view (No. 4) explaining the second portion of the manufacturing process of the semiconductor device according to the second embodiment.

Then, as illustrated as FIG. 8D, by removing the resist film $R_2$, the structure is obtained in which the electrode pad 11a is formed on the seed layer 11s covering the mounting surface 11A of the circuit board 11.

Figure 8E:
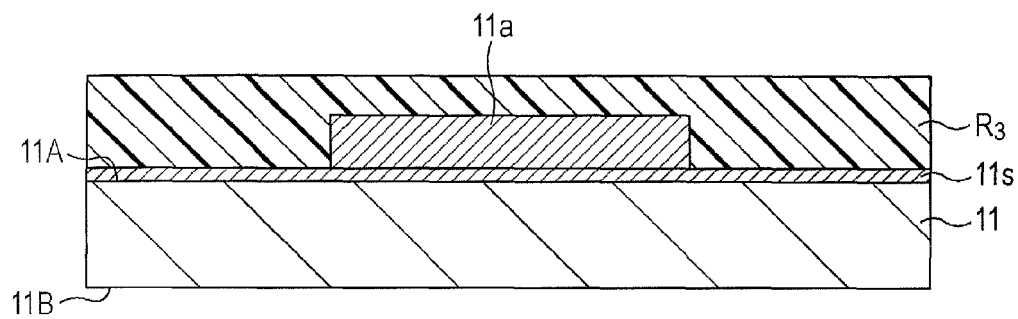
FIG. 8E is another view (No. 5) explaining the second portion of the manufacturing process of the semiconductor device according to the second embodiment.
Figure 8F:
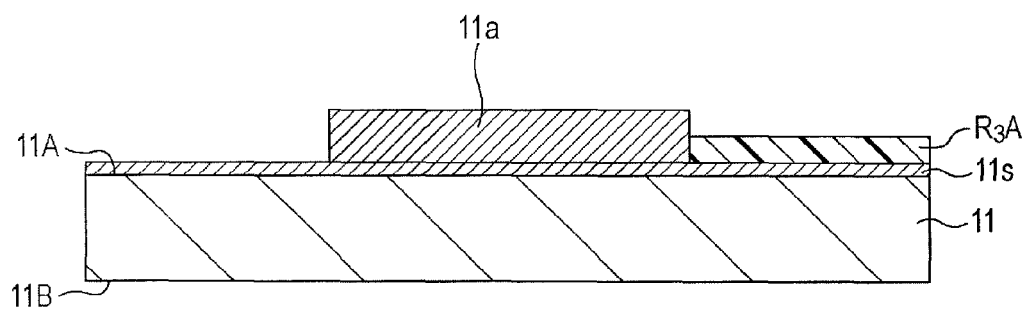
FIG. 8F is another view (No. 6) explaining the second portion of the manufacturing process of the semiconductor device according to the second embodiment.

Then, in this embodiment, as illustrated in FIG. 8E, a resist film $R_3$ is formed on the structure of FIG. 8D, and then the resist film $R_3$ is exposed and developed to form a resist pattern $R_3A$ as illustrated as FIG. 8F, so that the resist pattern $R_3A$ protects a portion corresponding to the wiring pattern 11b formed on the mounting surface 11A of the circuit board 11 previously described with reference to FIG. 1C.

Figure 9A:
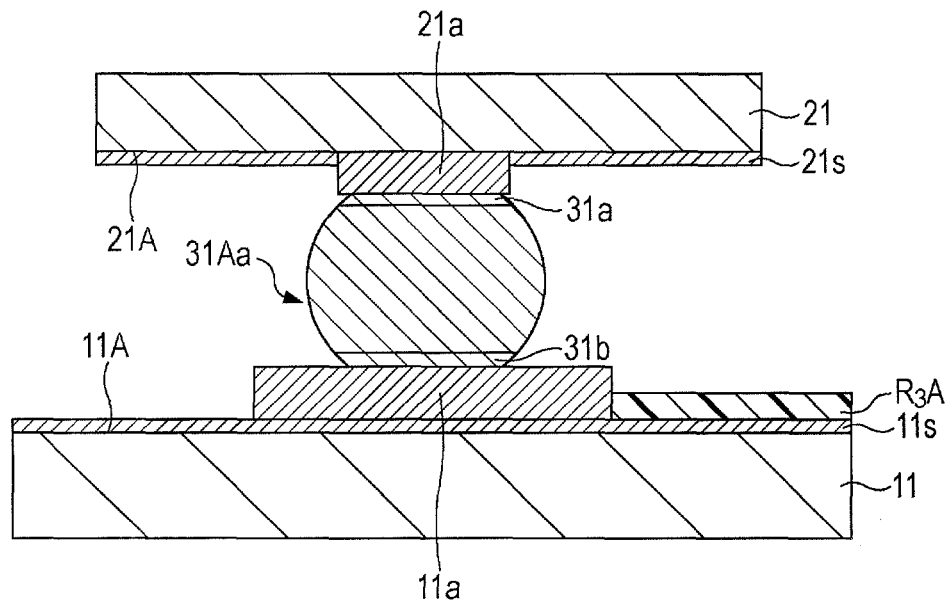
FIG. 9A is another view (No. 1) explaining a third portion of the manufacturing process of the semiconductor device according to the second embodiment.

Then, as illustrated as FIG. 9A, a solder bump 31Aa containing a Sn—Bi alloy and having an initial composition closer to the eutectic composition, for example, is supported on the electrode pad 21a in the structure of FIG. 7D through a flux layer. Then, the semiconductor chip 21 in which the solder bump 31Aa is supported on the electrode pad 21a as described above is placed on the circuit board 11 in such a manner that the circuit formed surface 21A faces the mounting surface 11A of the circuit board 11, and the solder bump 31Aa is abutted on the electrode pad 11a on the mounting surface 11A.

Then, the solder bump 31Aa of the initial composition is reflowed at a temperature of 139° C. in the state, and the semiconductor chip 21 is mounted on the circuit board 11 through the solder bump 31Aa.

Figure 9B:
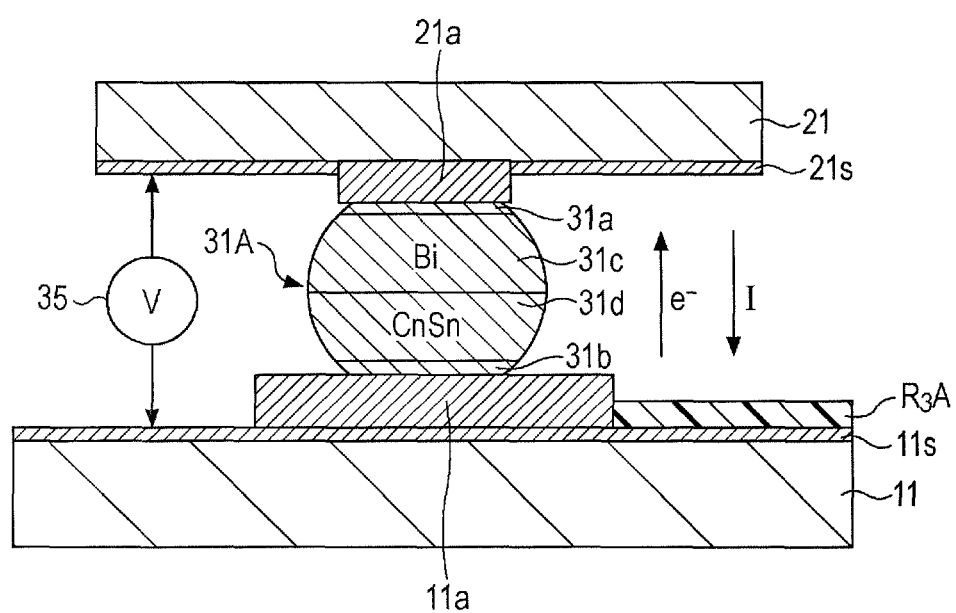
FIG. 9B is another view (No. 2) explaining the third portion of the manufacturing process of the semiconductor device according to the second embodiment.

Next, as illustrated as FIG. 9B, a direct-current power supply 35 is connected between the seed layer 21s and the seed layer 11s, and then the direct current I is applied to the solder bump 31Aa from the electrode pad 21a as an anode to the electrode pad 11a as a cathode, in other words, an electron flow e⁻ is applied from the electrode pad 11a as a cathode to the electrode pad 21a as an anode.

As a result, as previously described with reference to FIG. 3A and FIG. 3B, Bi concentrates to the electrode pad 21a, i.e., a side near the anode, in the solder bump 31Aa of the initial composition to form the first intermediate region 31c, and Sn concentrates to the electrode pad 11a, i.e., a side near the cathode, to form the second intermediate region 31d, so that the solder bump 31Aa of the initial composition changes to the solder bump 31A.

When the direction of the direct current I is reversed in the process of FIG. 9B, the structure previously described with reference to FIG. 2B is obtained in which the second intermediate region 31d is formed adjacent to the first interface layer 31a and the first intermediate region 31c is formed adjacent to the second interface layer 31b.

Figure 9C:
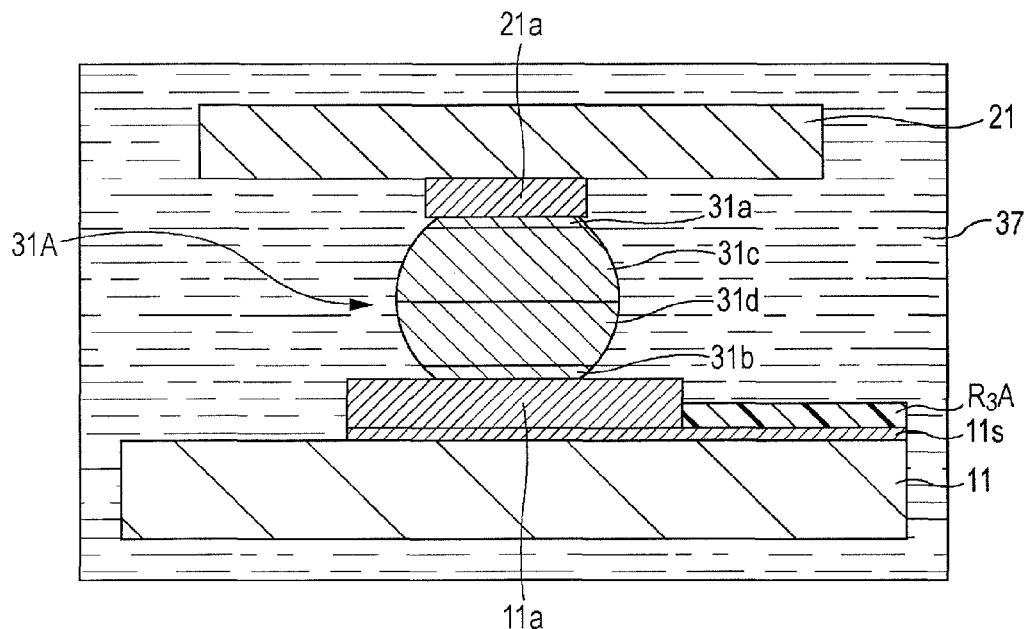
FIG. 9C is another view (No. 3) explaining the third portion of the manufacturing process of the semiconductor device according to the second embodiment.
Figure 9D:
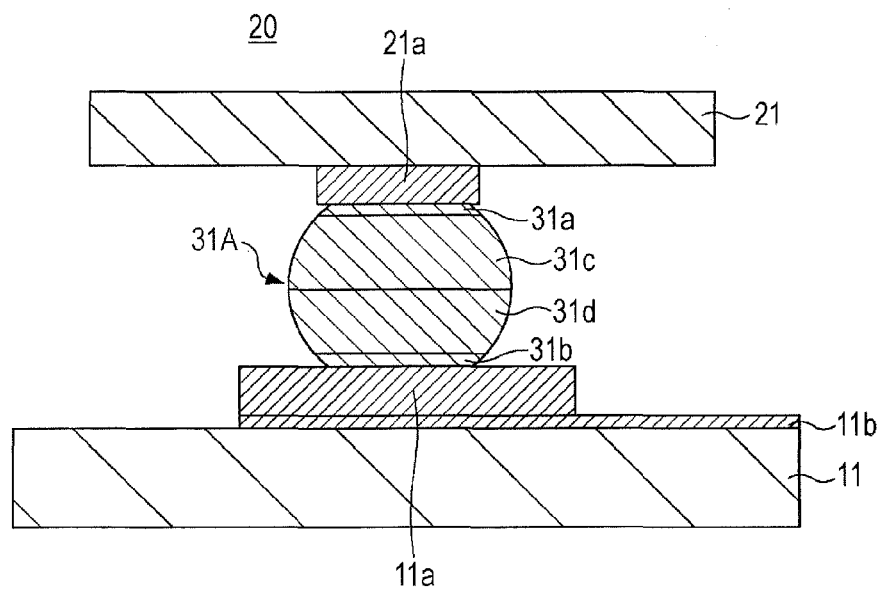
FIG. 9D is another view (No. 4) explaining the third portion of the manufacturing process of the semiconductor device according to the second embodiment.

Next, as illustrated as FIG. 9C, the structure of FIG. 9B is immersed in an etchant 37, for example, containing potassium hydrogensulfate as the main ingredients, for example, for 1 minute. Thus, the seed layer 21s and a portion of the seed layer 11s which is not protected by the resist pattern $R_3A$ are removed by etching. This etching is carried out only for removing the thin seed layers 21s and 11s, and the thick electrode pads 21a and 11a are not substantially affected.

After pulling up from the etchant 37, the resist pattern $R_3A$ is removed by, for example, a peeling liquid or the like, ashing in oxygen plasma, or the like to complete the semiconductor device 20 of the configuration in which the semiconductor chip 21 is electrically and mechanically connected onto the circuit board 11 through the solder bump 31A and the predetermined wiring pattern 11b is formed on the mounting surface 11A of the circuit board 11.

In this embodiment, any one of the processes of FIG. 7A to FIG. 7D and any one of the processes of FIG. 8A to FIG. 8F may be performed first, and may be simultaneously performed at the same time.

Although the same wiring pattern is also formed on the back surface 11B of the circuit board 11 in this embodiment, the explanation is omitted.

According to the above-described embodiments, by joining a semiconductor chip and a circuit board or a first connection member and a second connection member by reflowing solder bumps containing a Sn—Bi alloy, and then applying a direct current to the solder bumps, a region where the Bi concentration is high and a region where the Sn concentration is high may be formed in such a manner as to be isolated from each other in the solder bumps. Therefore, the melting temperature of the solder bumps may be made higher than the initial melting temperature.

Third Embodiment

Figure 10:
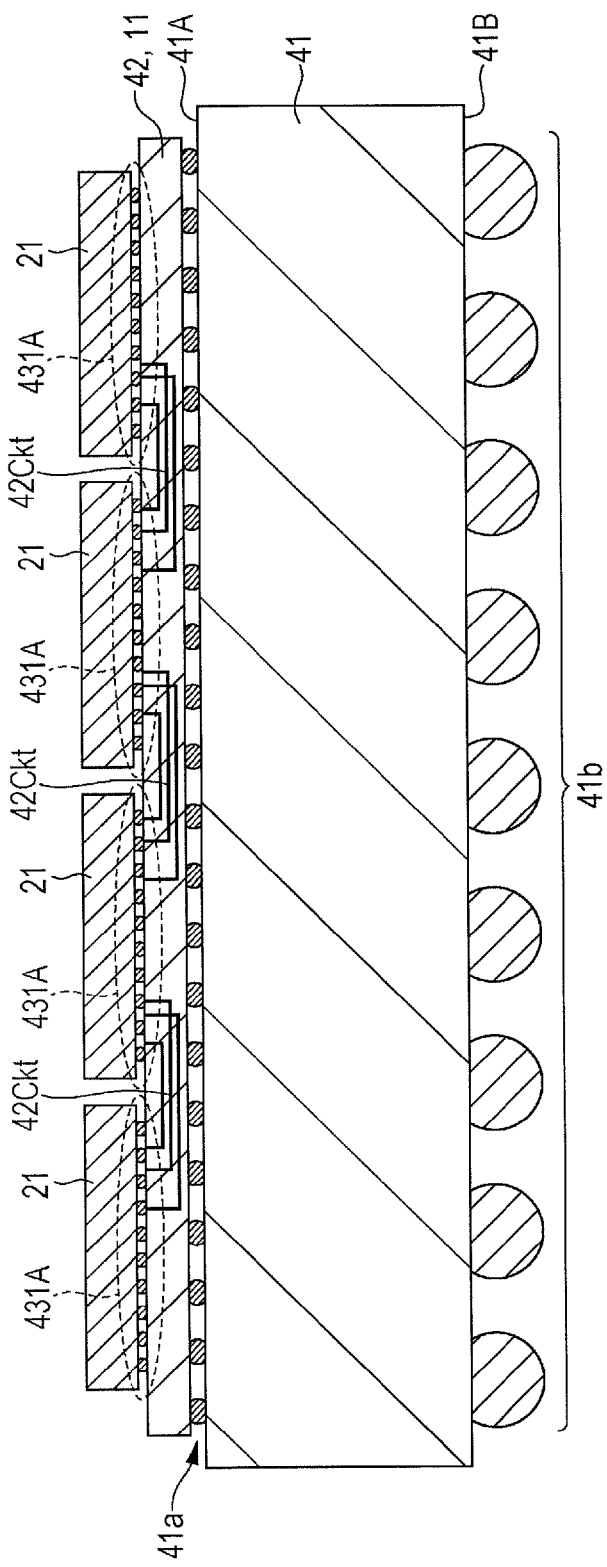
FIG. 10 is a cross sectional view illustrating the configuration of a semiconductor device according to a third embodiment.

FIG. 10 is a cross sectional view illustrating the outline of a semiconductor device 40 according to a third embodiment.

Referring to FIG. 10, the semiconductor device 40 has a package substrate 41 having principal surfaces 41A and 41B forming the front surface and the back surface, respectively. An interposer 42 mounted on the principal surface 41A of the package substrate 41 by Sn—Bi solder bumps 41a, and the interposer 42 is correspondent to the circuit board 11 in the embodiments above. Additionally, a large number of the semiconductor chips 21 mounted on the interposer 42 by solder bump arrays 431A each containing the solder bumps 31A, in which a large number of circuit patterns 42Ckt are formed by a multilayer interconnection structure in the interposer 42. Further, on the principal surface 41B of the package substrate 41, different solder bumps 41b for mounting on a system board or the like are formed.

Further, although not illustrated, circuits by a multilayer interconnection structure are formed on the principal surfaces 41A and 41B of the package substrate 41.

When assembling such a semiconductor device 40, in order to reduce thermal stress to the semiconductor chips 21, the semiconductor chips 21 are mounted on the interposer 42 using a Sn—Bi solder having a usual eutectic composition in the solder bump arrays 431A. Thereafter, when the interposer 42 is mounted on the package substrate 41, or, furthermore, when the package substrate 41 is mounted on a system board or the like of an electronic device, later, a problem arises in that the solder bumps constituting the solder bump arrays 431A re-malt with the heat treatment for reflowing the solder bumps 41a and 41b.

In order to solve the problem, in this embodiment, when the semiconductor chip 21 is mounted on the interposer 42, a direct current is applied to the solder bump 31A to isolate the bump 31A to a region abundant in Bi, i.e., the first intermediate region 31c, and a region abundant in Sn, i.e., the second intermediate region 31d, as described in the embodiments above. Therefore, the melting temperature of the entire solder bump 31A increases from the initial temperature in mounting, e.g., 139° C., to 215° C. or higher. Therefore, even when reflowing the solder bump 41a or 41b later, the solder bumps 31A does not re-melt.

Similarly, in this embodiment, also with respect to the solder bump 41a, the interposer 42 is mounted on the package substrate 41, and then a direct current is applied to thereby isolate each solder bump 41a to a region abundant in Bi and a region abundant in Sn therein. Therefore, the melting temperature of the solder bump 41a becomes higher than the temperature during reflow, so that a problem of re-melting or the like of the solder bump 41a does not occur when mounting the package substrate 41. Also when the semiconductor device 40 is subjected to a thermal cycle test and a high temperature exposure test, the connection does not become poor.

Thus, according to this embodiment, in the configuration in which a large number of components are stacked while mounting by solder bumps, the melting temperature of the solder bumps may be increased after mounting, so that a high-reliable electronic device may be manufactured at a high yield.

Fourth Embodiment

Figure 11:
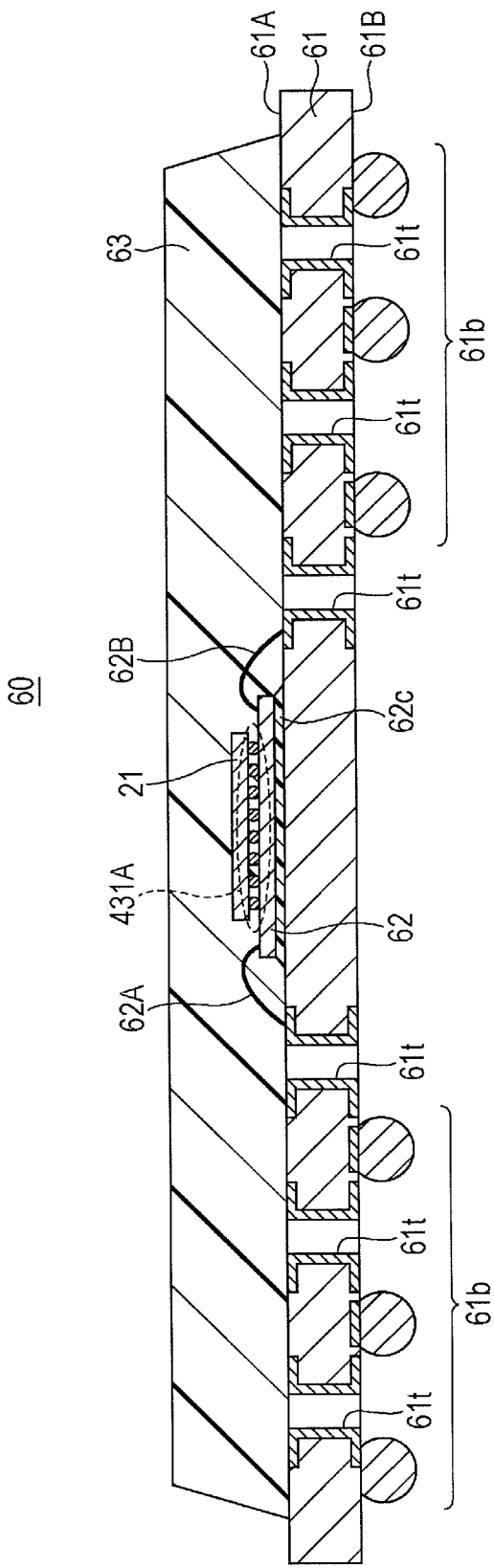
FIG. 11 is a cross sectional view illustrating the configuration of a semiconductor device according to a fourth embodiment.

FIG. 11 is a cross sectional view illustrating the configuration of a semiconductor device 60 according to a fourth embodiment.

Referring to FIG. 11, the semiconductor device 60 has a circuit board 61 having principal surfaces 61A and 61B, in which a semiconductor chip 62 is joined onto the principal surface 61A of the circuit board 61 in a face-up state through a resin layer 62C, i.e., the circuit formed surface on which a semiconductor integrated circuit is formed is the upper side, in other words facing a side opposite to the circuit board 61.

Furthermore, the semiconductor chip 21 is mounted on the semiconductor chip 62 in a face-down state through the solder bump array 431A described above, and the semiconductor chip 62 is electrically connected to the circuit pattern formed on the principal surface 61A of the circuit board 61 by bonding wires 62A and 62B.

On the principal surface 61A, the semiconductor chips 62 and 21 are sealed together with the bonding wires 62A and 62B with a sealing resin 63 and a large number of through vias 61*t* are formed in the circuit board 61. The circuit pattern on the principal surface 61A is electrically connected to the circuit pattern formed on the principal surface 61B through the through vias 61*t*.

On the principal surface 61B, a large number of solder bumps 61*b* are formed. The circuit board 61 is mounted on a system board, for example, of various electronic devices, such as a server, through the solder bumps 61*b*.

Also in this embodiment, the solder bumps 31A constituting the solder bump array 431A are electrified after reflowing at a low temperature of 139° C. as described above, and, as a result, the melting temperature increases to 215° C. or higher, for example.

Therefore, even when the semiconductor device 60 is mounted on another substrate by reflowing the solder bumps 61*b* and even when the electronic device thus formed is subjected to various thermal cycle tests and high temperature exposure tests, the solder bumps 31A constituting the solder bump array 431A do not re-melt.

Thus, according to this embodiment, a high-reliable semiconductor device may be manufactured at a high yield.

Fifth Embodiment

The semiconductor devices according to various embodiments described above may be variously applied, e.g., from application to electronic devices for so-called high-end use, such as a server 70 having a system board 71, as illustrated as FIG. 12 to application to a circuit wiring board of electronic devices for popular use, such as cellular phones and digital cameras.

Referring to FIG. 12, the semiconductor device 40 of FIG. 10 or the semiconductor device 60 of FIG. 11, for example, is flip-chip mounted on the system board 71 together with a memory module 71B and the like through the solder bumps 41*b* or 61*b* in a state where a heat dissipation member 71A is supported.

Preferable embodiments are described above but embodiments are not limited to specific embodiments and may be variously modified and altered within the scope of the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
    a first connection member that includes a first connection pad formed on a first principal surface of the first connection member;
    a fast semiconductor chip that includes a circuit-formed surface on which a semiconductor integrated circuit is formed and a second connection pad formed on the circuit-formed surface, the fast semiconductor chip mounted on the first connection member in such a manner that the circuit-formed surface faces the first principal surface; and
    a solder bump that connects the first connection pad to the second connection pad and is made of metal containing Bi and Sn,
    wherein the solder bump includes a first interface layer containing a Cu—Sn alloy and formed adjacent to the second connection pad, a second interface layer containing a Cu—Sn alloy and formed adjacent to the first connection pad, a first intermediate region formed adjacent to and in direct contact with either one of the first interface layer or the second interface layer, and a second intermediate region formed adjacent to and in direct contact with the other one of the first interface layer and the second interface layer and formed adjacent to the first intermediate region;
    a concentration of Bi in the first intermediate region is higher than a concentration of Sn in the first intermediate region; and
    a concentration of Sn in the second intermediate region is higher than a concentration of Bi in the second intermediate region.

2. The semiconductor device according to claim 1, wherein the first intermediate region substantially does not contain Sn and the second intermediate region substantially does not contain Bi.

3. The semiconductor device according to claim 1, wherein the first intermediate region substantially does not contain Sn and the second intermediate region is made of an alloy of Sn and Bi.

4. The semiconductor device according to claim 1, wherein the second intermediate region contains an intermetallic compound or a solid solution of Sn and a metal element constituting either one of the first or second connection pads which is adjacent to the other one of the first and the second interface layers adjacent to the second intermediate region.

5. The semiconductor device according to claim 4, wherein the metal element is selected from a group consisting of copper, nickel, antimony, palladium, silver, gold, platinum, and cobalt.

6. The semiconductor device according to claims 1, wherein the concentration of Bi in the first intermediate region exceeds 85 wt %.

7. The semiconductor device according to claim 1, wherein the first connection member is a second semiconductor chip different from the fast semiconductor chip.

8. The semiconductor device according to claims 1, wherein the first connection member is an interposer that includes a second principal surface facing the first major surface and includes a third connection pad formed on the second principal surface being electrically connected to the first connection pad.

9. The semiconductor device according to claim 8, further comprising:
a wiring board,
wherein the semiconductor device being mounted on a principal surface of the wiring board using a second solder bump formed on the third connection pad.

10. An electronic device, comprising:
a system board; and
a semiconductor device that is flip-chip mounted on the system board, comprising:
a first connection member that includes a first connection pad formed on a first principal surface of the first connection member;
a fast semiconductor chip that includes a circuit-formed surface on which a semiconductor integrated circuit is formed and a second connection pad formed on the circuit-formed surface, the fast semiconductor chip mounted on the first connection member in such a manner that the circuit-formed surface faces the first principal surface; and
a solder bump that connects the first connection pad to the second connection pad and is made of metal containing Bi and Sn,
wherein the solder bump includes a first interface layer containing a Cu—Sn alloy and formed adjacent to the second connection pad, a second interface layer containing a Cu—Sn alloy and formed adjacent to the first connection pad, a first intermediate region formed adjacent to and in direct contact with either one of the first interface layer or the second interface layer, and a second intermediate region formed adjacent to and in direct with the other one of the first interface layer and the second interface layer and formed adjacent to the first intermediate region;
a concentration of Bi in the first intermediate region is higher than a concentration of Sn in the first intermediate region; and
a concentration of Sn in the second intermediate region is higher than a concentration of Bi in the second intermediate region.

\* \* \* \* \*